US009972432B2

United States Patent
Asada

(10) Patent No.: US 9,972,432 B2
(45) Date of Patent: May 15, 2018

(54) LAMINATED COIL COMPONENT, MODULE COMPONENT, AND METHOD OF MANUFACTURING LAMINATED COIL COMPONENT

(71) Applicant: Murata Manufacturing Co., Ltd., Nagaokakyo-shi, Kyoto-fu (JP)

(72) Inventor: Yoshihiro Asada, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days. days.

(21) Appl. No.: 15/271,495

(22) Filed: Sep. 21, 2016

(65) Prior Publication Data

US 2017/0011838 A1 Jan. 12, 2017

Related U.S. Application Data

(63) Continuation of application No. PCT/JP2015/060355, filed on Apr. 1, 2015.

(30) Foreign Application Priority Data

Apr. 3, 2014 (JP) .................................. 2014-077233

(51) Int. Cl.
H01F 27/28 (2006.01)
H05K 1/18 (2006.01)
(Continued)

(52) U.S. Cl.
CPC ..... *H01F 27/2804* (2013.01); *H01F 17/0013* (2013.01); *H01F 27/29* (2013.01);
(Continued)

(58) Field of Classification Search
CPC .... H01F 27/29; H01F 27/292; H01F 27/2804; H01F 27/2809; H01F 17/0013; H01F 17/002; H05K 1/18; H05K 1/181
See application file for complete search history.

(56) References Cited

U.S. PATENT DOCUMENTS

2011/0102124 A1* 5/2011 Matsushita ......... H01F 17/0013
336/200
2013/0229167 A1 9/2013 Hiei

FOREIGN PATENT DOCUMENTS

JP 2012-164770 A 8/2012
JP 2012164770 A * 8/2012
(Continued)

OTHER PUBLICATIONS

English translation of Official Communication issued in corresponding International Application PCT/JP2015/060355, dated Jun. 16, 2015.

*Primary Examiner* — Hoa C Nguyen
*Assistant Examiner* — Amol Patel
(74) *Attorney, Agent, or Firm* — Keating & Bennett, LLP

(57) ABSTRACT

In a laminated coil component, patterned conductor portions of a first coil portion and patterned conductor portions of a second coil portion are provided on respective insulation layers adjacent in a lamination direction, and include portions that overlap with each other when viewed in plan view. The insulation layers on which the patterned conductor portions of the second coil portion are provided are laminated between the plurality of insulation layers on which the patterned conductor portions of the first coil portion are provided. A first outer electrode to which the first coil portion is electrically connected and a second outer electrode to which the second coil portion is electrically connected are provided on the same main surface of a multilayer body.

15 Claims, 13 Drawing Sheets

(51) Int. Cl.
*H01F 27/29* (2006.01)
*H01F 17/00* (2006.01)
*H05K 1/02* (2006.01)
*H05K 1/16* (2006.01)
*H01F 17/04* (2006.01)

(52) U.S. Cl.
CPC ......... *H01F 27/292* (2013.01); *H05K 1/0268* (2013.01); *H05K 1/165* (2013.01); *H05K 1/18* (2013.01); *H01F 17/0033* (2013.01); *H01F 17/04* (2013.01); *H01F 2027/2809* (2013.01); *H05K 2201/09518* (2013.01)

(56) References Cited

FOREIGN PATENT DOCUMENTS

| | | |
|---|---|---|
| JP | 5136732 B1 | 2/2013 |
| JP | 2013-143471 A | 7/2013 |
| WO | 2010/007858 A1 | 1/2010 |

\* cited by examiner

LAMINATED COIL COMPONENT, MODULE COMPONENT, AND METHOD OF MANUFACTURING LAMINATED COIL COMPONENT

CROSS REFERENCE TO RELATED APPLICATIONS

This application claims the benefit of priority to Japanese Patent Application 2014-077233 filed Apr. 3, 2014 and is a Continuation Application of PCT/JP2015/060355 filed on Apr. 1, 2015, the entire contents of each application are hereby incorporated by reference.

BACKGROUND OF THE INVENTION

1. Field of the Invention

The present invention relates to a laminated coil component, a module component that includes a multilayer coil component, and a method of manufacturing a laminated coil component.

2. Description of the Related Art

The electronic component disclosed in Japanese Unexamined Patent Application Publication No. 2013-143471 is known as an example of a conventional laminated coil component. The electronic component disclosed in Japanese Unexamined Patent Application Publication No. 2013-143471 includes a multilayer body, two outer electrodes, and a coil. The multilayer body is formed by laminating a plurality of insulation layers, and contains the coil therewithin. Both ends of the coil are connected to the two outer electrodes respectively by via hole conductors.

Electronic devices are becoming thinner in recent years, and there is demand for lower profiles in laminated coil components. Achieving such lower profiles requires either reducing the number of insulation layers or making the insulation layers thinner. Higher inductance values are also in demand for laminated coil components. Increasing the number of laminated layers, increasing the number of turns in the coil, and so on are useful ways of ensuring a sufficiently high inductance value. It is necessary to make the insulation layers thinner in order to increase the number of insulation layers.

As such, in laminated coil components, there is demand for the insulation layers to be made thinner.

As insulation layers become thinner, the insulation resistance of the insulation layers drops due to small pieces of dust or the like entering when the insulation layers are laminated. This makes it easy for so-called interlayer shorting, where windings of the coil adjacent in the lamination direction short, to occur.

A laminated coil component in which interlayer shorting has occurred is considered defective and must therefore be removed. However, in conventional laminated coil components, interlayer shorting causes a small drop in the inductance value, which makes it difficult to detect that the component is defective even if the inductance value of the coil is measured. There has thus been a problem in that components have been determined to be non-defective despite interlayer shorting occurring therein.

In addition, a laminated coil component is sometimes used as a module such as a DC-DC converter, with an IC or the like mounted on the main surface of the laminated coil component. Here, it is often the case that interlayer shorting is first discovered only after the IC has been mounted. This is because even an extremely small drop in the inductance value has a large effect on the operations of the IC. As such, the laminated coil component alone cannot be removed as defective and is only detected as defective after the entire module, including the IC, has been completed. In principle, an IC that has been mounted once cannot be reused. ICs are expensive products, and more ICs are mounted the larger the module is. Thus, in order to avoid wasting such expensive ICs, it is desirable that defects be detected in a laminated coil component alone before ICs or the like are mounted thereon.

SUMMARY OF THE INVENTION

Preferred embodiments of the present invention provide a laminated coil component according to the present invention including a coil conductor including a multilayer body that includes a plurality of insulation layers and a pair of main surfaces and side surfaces that connect the main surfaces, patterned conductor portions that are provided within the multilayer body and are provided on respective ones of the plurality of insulation layers, and interlayer connecting conductor portions that pass through the insulation layers and electrically connect a plurality of patterned conductor portions; and first and second outer electrodes provided on one of the main surfaces of the multilayer body. The coil conductor includes a first coil portion and a second coil portion electrically connected in series; the patterned conductor portions that define the first coil portion and the patterned conductor portions that define the second coil portion are provided on respective insulation layers that are adjacent in a lamination direction, and include portions that overlap with each other when viewed in plan view; the insulation layers on which the patterned conductor portions that define the second coil portion are provided are laminated between the plurality of insulation layers on which the patterned conductor portions that define the first coil portion are provided; and the first outer electrode, which is electrically connected to the first coil portion, and the second outer electrode, which is electrically connected to the second coil portion, are provided on the same main surface of the multilayer body.

In a preferred embodiment of the present invention, the interlayer connecting conductor portions may be provided so that the coil conductor has the smallest possible length.

In a preferred embodiment of the present invention, the first coil portion may wind from the side where one of the main surfaces of the multilayer body is located toward the side where the other main surface is located, and the second coil portion may wind from the side where the other main surface of the multilayer body is located toward the side where the one main surface is located.

In a preferred embodiment of the present invention, the interlayer connecting conductor portions may be provided so that the patterned conductor portions in at least two layers are not used as an electrical path regardless of which insulation layer interlayer shorting has occurred.

In a preferred embodiment of the present invention, the first outer electrode may be connected, through the interlayer connecting conductor portions, to the patterned conductor portion of the first coil portion closest to the one main surface, and the second outer electrode may be connected to the patterned conductor portion of the second coil portion closest to the other main surface.

In a preferred embodiment of the present invention, there may be five or more of the insulation layers on which the patterned conductor portions are provided.

In a preferred embodiment of the present invention, the insulation layers may be laminated so that all of the patterned conductor portions that define the first coil portion and the patterned conductor portions that define the second coil portion are in alternating positions.

In a preferred embodiment of the present invention, of the patterned conductor portions that define the first coil portion and the patterned conductor portions that define the second coil portion, the patterned conductor portions that are adjacent in the lamination direction may include portions having the same pattern shape.

A module component according to another preferred embodiment of the present invention includes a laminated coil component as a multilayer substrate, and a mounted component is mounted on the multilayer substrate.

In a preferred embodiment of the present invention, an IC may be used as the mounted component.

According to various preferred embodiments of the present invention, the ability to detect defects caused by interlayer shorting of a coil conductor is significantly improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
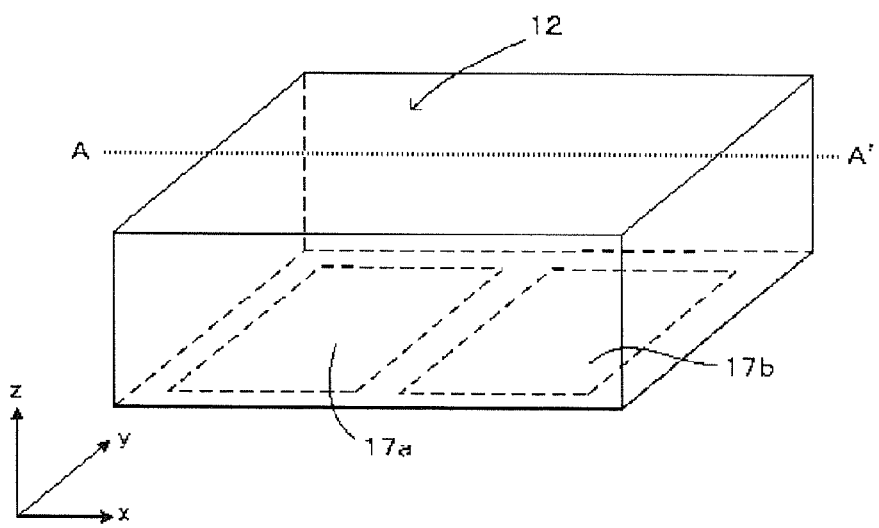
FIG. 1 is an external perspective view of a laminated coil component according to a first preferred embodiment of the present invention.
Figure 2:
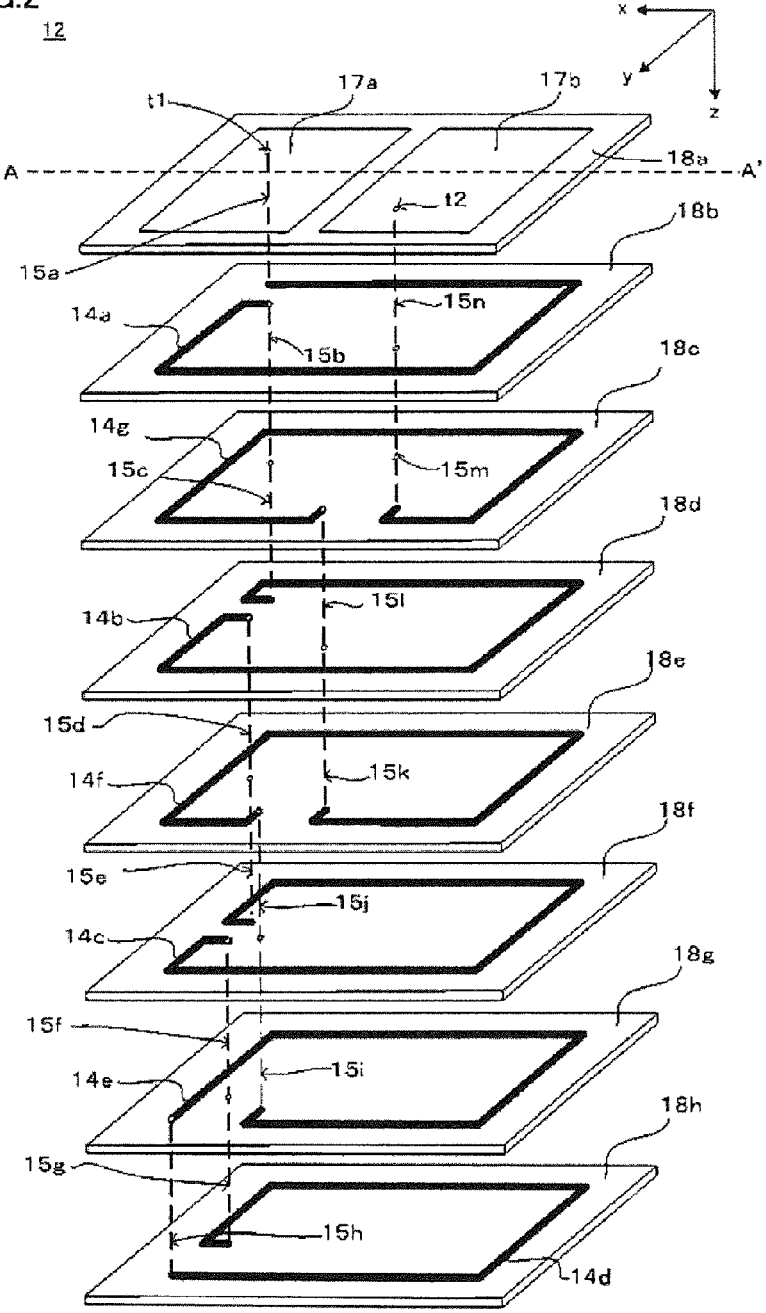
FIG. 2 is an exploded perspective view of the laminated coil component according to the first preferred embodiment of the present invention.
Figure 3:
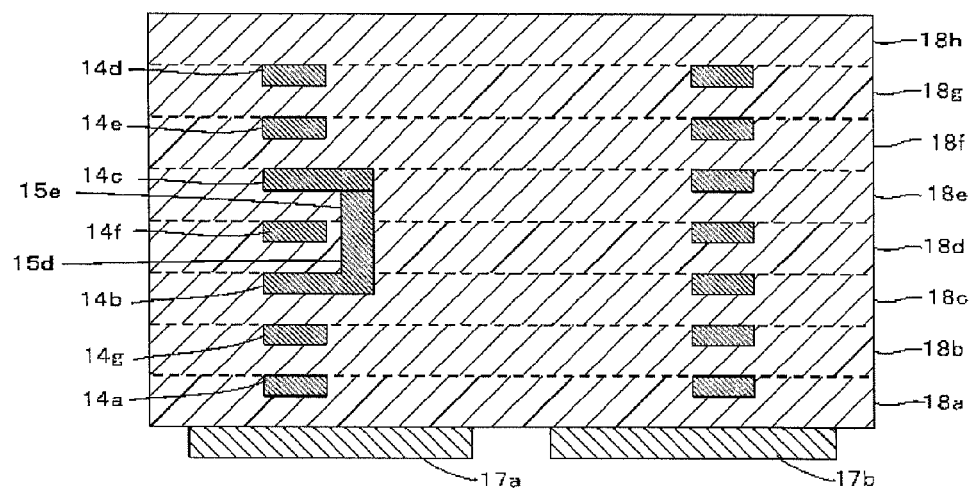
FIG. 3 is an A-A' cross-sectional view of the laminated coil component according to the first preferred embodiment of the present invention.

Laminated coil components and module components according to preferred embodiments of the present invention will be described hereinafter with reference to the drawings.
First Preferred Embodiment FIG. 1 is an external perspective view of a laminated coil component 1 according to a first preferred embodiment of the present invention. FIG. 2 is an exploded perspective view of a multilayer body 12 in the laminated coil component 1 illustrated in FIG. 1. FIG. 3 is an A-A' cross-sectional view of the laminated coil component 1 illustrated in FIG. 1. Note that FIG. 2 illustrates a lamination order used during manufacturing, and thus a z-axis direction is oriented in the opposite direction compared to FIGS. 1 and 3.

As illustrated in FIGS. 1 to 3, the laminated coil component 1 includes the multilayer body 12, and a first outer electrode 17a and a second outer electrode 17b provided on one main surface of the multilayer body 12. The multilayer body 12 preferably has a rectangular or substantially rectangular parallelepiped shape, and includes a coil conductor including patterned conductor portions 14a to 14g and interlayer connecting conductor portions 15a to 15n, which are via hole conductor portions. The multilayer body 12 includes insulation layers 18a to 18h laminated so that the insulation layers are arranged in that order. The insulation layers 18a to 18h preferably are rectangular or substantially rectangular in shape, and are preferably made of a magnetic material formed from a magnetic ferrite such as Ni—Cu—Zn, a non-magnetic material formed from a non-magnetic ferrite such as Cu—Zn, or the like.

As illustrated in FIG. 2, the patterned conductor portions 14a to 14g are provided upon the insulation layers 18b to 18h, respectively. The patterned conductor portions 14a to 14g are preferably made of a conductive material such as Ag, and are preferably shaped as rectangular or substantially rectangular patterns with a portion of the pattern cut out. The patterned conductor portions in adjacent layers (14a and 14g, for example) overlap with each other when viewed in plan view from a lamination direction.

The interlayer connecting conductor portions 15a to 15n are provided in the insulation layers 18a to 18g so as to pass therethrough in the thickness direction of the insulation layers. The interlayer connecting conductor portions 15a to 15n are electrically connected to the first outer electrode 17a, the patterned conductor portions 14a to 14g, and the second outer electrode 17b.

To be more specific, the patterned conductor portion 14a is connected to the outer electrode 17a by the interlayer connecting conductor portion 15a through an end portion t1 of the interlayer connecting conductor portion 15a. Additionally, an end portion of the patterned conductor portion 14a located on a different side from the end portion connected to the interlayer connecting conductor portion 15a is connected to the patterned conductor portion 14b by the interlayer connecting conductor portion 15b, which extends through the insulation layer 18b, and the interlayer connecting conductor portion 15c, which extends through the insulation layer 18c. As such, the patterned conductor portion 14a is connected to the patterned conductor portion 14b without being connected to the patterned conductor portion 14g provided therebetween in the lamination direction. Likewise, an end portion of the patterned conductor portion 14b located on a different side from the end portion connected to the interlayer connecting conductor portions 15b and 15c is connected to the patterned conductor portion 14c by the interlayer connecting conductor portion 15d, which extends through the insulation layer 18d, and the interlayer connecting conductor portion 15e, which extends through the insulation layer 18e. As such, the patterned conductor portion 14b is connected to the patterned conductor portion 14c without being connected to the patterned conductor portion 14f provided therebetween in the lamination direction. Furthermore, an end portion of the patterned conductor portion 14c located on a different side from the end portion connected to the interlayer connecting conductor portions 15d and 15e is connected to the patterned conductor portion 14d by the interlayer connecting conductor portion 15f, which extends through the insulation layer 18f, and the interlayer connecting conductor portion 15g, which extends through the insulation layer 18g. As such, the patterned conductor portion 14c is connected to the patterned conductor portion 14d without being connected to the patterned conductor portion 14e provided therebetween in the lamination direction. A first coil portion includes the interlayer connecting conductor portion 15a, the patterned conductor portion 14a, the interlayer connecting conductor portions 15b and 15c, the patterned conductor portion 14b, the interlayer connecting conductor portions 15d and 15e, the patterned conductor portion 14c, the interlayer connecting conductor portions 15f and 15g, and the patterned conductor portion 14d being connected.

To rephrase, the patterned conductor portions 14a to 14d and the interlayer connecting conductor portions 15a to 15g, which define a structure in which one end is connected to the first outer electrode 17a and an electrical path extends in the lamination direction away from the first outer electrode 17a, define and function as the first coil portion. In other words, the first coil portion according to the first preferred embodiment winds from the one main surface on the side where the outer electrodes are provided toward the other main surface.

Meanwhile, an end portion of the patterned conductor portion 14d located on a different side from the end portion connected to the interlayer connecting conductor portion 15g is connected to the patterned conductor portion 14e by the interlayer connecting conductor portion 15h, which extends through the insulation layer 18g. An end portion of the patterned conductor portion 14e located on a different side from the end portion connected to the interlayer connecting conductor portion 15h is connected to the patterned conductor portion 14f by the interlayer connecting conductor portion 15i, which extends through the insulation layer 18f, and the interlayer connecting conductor portion 15j, which extends through the insulation layer 18e. As such, the patterned conductor portion 14e is connected to the patterned conductor portion 14f without being connected to the patterned conductor portion 14c provided therebetween in the lamination direction. Likewise, an end portion of the patterned conductor portion 14f located on a different side from the end portion connected to the interlayer connecting conductor portions 15i and 15j is connected to the patterned conductor portion 14g by the interlayer connecting conductor portion 15k, which extends through the insulation layer 18d, and the interlayer connecting conductor portion 15l, which extends through the insulation layer 18c. As such, the patterned conductor portion 14f is connected to the patterned conductor portion 14g without being connected to the patterned conductor portion 14b provided therebetween in the lamination direction. Additionally, an end portion of the patterned conductor portion 14g located on a different side from the end portion connected to the interlayer connecting conductor portions 15k and 15l is connected to the second outer electrode 17b by the interlayer connecting conductor portions 15m and 15n, through an end portion t2 of the interlayer connecting conductor portion 15h.

A second coil portion includes the interlayer connecting conductor portion 15h, the patterned conductor portion 14e, the interlayer connecting conductor portions 15i and 15j, the patterned conductor portion 14f, the interlayer connecting conductor portions 15k and 15l, the patterned conductor portion 14g, and the interlayer connecting conductor portions 15m and 15n being connected.

To rephrase, the patterned conductor portions 14e to 14g and the interlayer connecting conductor portions 15h to 15n, which define a structure in which one end is connected to the patterned conductor portion 14d of the first coil portion, another end is connected to the second outer electrode 17b, and an electrical path extends in the lamination direction from the patterned conductor portion 14d toward the second outer electrode 17b, define and function as the second coil portion. In other words, the second coil portion winds from the other main surface of the multilayer body toward the one main surface. To put this differently, the second coil portion includes patterned conductor portions and interlayer connecting conductor portions that wind from the patterned conductor portion in the lowermost layer of the second coil portion (on the side farthest from the main surface on which the outer electrodes are formed) toward the main surface of the multilayer body on which the outer electrodes are provided.

A coil conductor is provided by electrically connecting the first coil portion and the second coil portion in series. Accordingly, as illustrated in FIG. 2, the coil conductor includes the patterned conductor portions 14a to 14g and the interlayer connecting conductor portions 15a to 15n. Additionally, as illustrated in FIGS. 2 and 3, the coil conductor is electrically connected by the interlayer connecting conductor portions 15a to 15n such that the patterned conductor portions of the first coil portion and the patterned conductor portions of the second coil portion are all positioned in an alternating manner in the lamination direction. When the coil conductor is viewed as electrical paths, one each of an interlayer connecting conductor portion for a path progressing toward the one main surface of the multilayer body and an interlayer connecting conductor portion for a path progressing toward the other main surface of the multilayer body are provided in all of the insulation layers 18b to 18g, interposed between the patterned conductor portions of the first coil portion and the patterned conductor portions of the second coil portion.

Meanwhile, the one end portion t1 of the coil conductor (this is also the end portion t1 of the interlayer connecting conductor portion 15a) is connected to the patterned conductor portion 14a and the first outer electrode 17a through the interlayer connecting conductor portion 15a provided in the insulation layer 18a, and the other end portion t2 of the coil conductor (this is also the end portion t2 of the interlayer connecting conductor portion 15n) is connected to the patterned conductor portion 14g and the second outer electrode 17b through the interlayer connecting conductor portion 15m provided in the insulation layer 18b and the interlayer connecting conductor portion 15n provided in the insulation layer 18a.

The first outer electrode 17a and the second outer electrode 17b are provided on the one main surface (the same main surface) of the multilayer body 12.

According to the laminated coil component 1 as described thus far, an inductance value drops greatly when interlayer shorting occurs, and thus a laminated coil component in which interlayer shorting has occurred is able to be accurately detected as defective.

To describe this using an example, assume that interlayer shorting has occurred in an insulation layer relatively near the outer electrodes 17a and 17b in the lamination direction, such as the insulation layer 18b between the patterned conductor portion 14a and the patterned conductor portion 14g. In the case where no interlayer shorting has occurred, the path of the coil conductor progresses from the first outer electrode 17a, connects, through the end portion t1 of the coil conductor, to the interlayer connecting conductor portions 15a to 15n and the patterned conductor portions 14a to 14g, and then connects to the second outer electrode 17b through the end portion t2 of the coil conductor. However, when interlayer shorting occurs, the patterned conductor portion 14a and the patterned conductor portion 14g are connected, which makes the path much shorter than the path of the coil conductor in the case where no interlayer shorting occurs. Specifically, five layers' worth of patterned conductor portions, namely the patterned conductor portions 14b, 14c, 14d, 14e, and 14f, are not used in the path, and thus the inductance value drops by an amount corresponding to those five layers. This makes it easy to detect defects caused by interlayer shorting.

Figure 4:
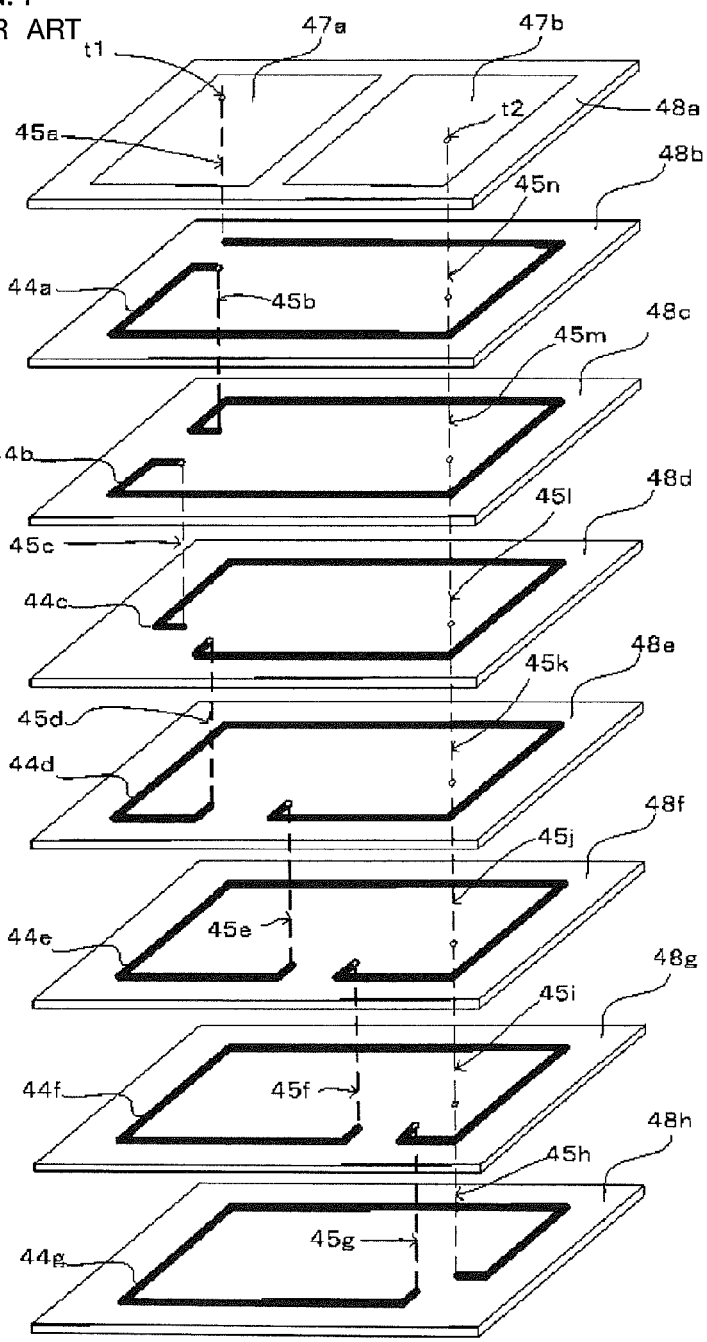
FIG. 4 is an exploded perspective view of a laminated coil component in which a coil is configured using a conventional winding method.

For comparative purposes, FIG. 4 is an exploded perspective view illustrating a case where a laminated coil component having the same inductance value as that of the first preferred embodiment is configured with a conventional winding method. A laminated coil component configured with a conventional winding method refers to being configured with a winding method in which the electrical connections are made in the lamination order. Assume that interlayer shorting has occurred in an insulation layer 48b located between a patterned conductor portion 44a and a patterned conductor portion 44b, as in the first preferred embodiment. In the conventional laminated coil component, even if interlayer shorting occurs and the path of the patterned conductor portion 44a and a patterned conductor portion 44b shortens, the path that follows thereafter does not change. The path therefore only changes by an amount equivalent to a single layer's worth of patterned conductor portions, which causes a smaller drop in the inductance value than in the first preferred embodiment. It is therefore difficult to detect defects caused by interlayer shorting in laminated coil components using a conventional winding method.

Additionally, in the present preferred embodiment, the shapes of patterned conductor portions vertically adjacent in the lamination direction (14a and 14g, for example) are the same aside from regions near the locations where portions of the rectangular or substantially rectangular patterns of the patterned conductor portions are cut out, and overlap with each other when viewed in plan view from the lamination direction, as illustrated in FIG. 2. To rephrase, in areas aside from the vicinity of the interlayer connecting conductor portions that connect upward and downward, the pattern shapes of the patterned conductor portions vertically adjacent to each other are the same for no less than half the lengths thereof. This is done to provide patterned conductor portions that are as long as possible in the insulation layers, in order to increase the inductance value to the greatest extent possible. However, interlayer shorting is more likely to occur the more the vertically-adjacent patterns overlap with each other. Various preferred embodiments of the present invention are thus even more useful in such cases.

Meanwhile, interlayer shorting is more likely to occur in a structure where the first and second outer electrodes 17a and 17b are provided on the same surface of the multilayer body 12, and thus it is necessary for the above-described defect detection to be accurate. In other words, when the first and second outer electrodes 17a and 17b are provided on the insulation layer 18a, which is the uppermost layer, compressive stress in accordance with the thickness of the first and second outer electrodes 17a and 17b is produced in the lamination direction when the insulation layers 18a to 18h are stacked and pressure-bonded. This makes it more likely for interlayer shorting to occur between the patterned conductor portions 14a to 14g. It is particularly likely for interlayer shorting to occur the closer the layer is to the first and second outer electrodes 17a and 17b. Various preferred embodiments of the present invention are thus even more useful in this case.

Additionally, in the first preferred embodiment, the interlayer connecting conductor portions 15a to 15n are preferably provided so that the coil conductor has the smallest possible length. Specifically, in the case where an interlayer connecting conductor portion passing through a single insulation layer is counted as one, the coil conductor is made up of the lowest possible number of via hole conductors overall. This ensures high productivity and makes it possible to reduce costs when putting the component into actual use.

Note that the shapes of the patterned conductor portions may be structured so that when viewed in plan view, rather than completely overlapping, the portions only partially overlap in regions aside from the vicinity of the areas of the patterned conductor portions where the pattern is partially cut out.

A non-limiting example of a method of manufacturing the laminated coil component 1 will be described hereinafter with reference to the drawings. Note that the following describes a non-limiting example of a method of manufacturing used when manufacturing a plurality of laminated coil components 1 at the same time.

First, ceramic green sheets, which will define and function as the insulation layers 18a to 18h illustrated in FIG. 2, are prepared. Specifically, ferric oxide ($Fe_2O_3$), zinc oxide (ZnO), copper oxide (CuO), nickel oxide (NiO), and the like are weighed at a predetermined ratio, placed in a ball mill as raw materials, and wet-blended. The obtained mixture is dried and then ground into a powder, and the obtained powder is then calcinated at 800° C. for one hour. The obtained calcinated powder is then elutriated in a ball mill, dried, and then crushed so as to obtain a ferrite ceramic powder.

A binder (vinyl acetate, an aqueous acrylic material, or the like), a plasticizer, a humectant, and a dispersant are added to the ferrite ceramic powder, which is then mixed in a ball mill, after which the mixture is defoamed through pressure reduction. A ceramic slurry obtained as a result is then formed into a sheet shape on a carrier sheet through the doctor blade method and dried, thus forming a ceramic green sheet that will define and function as the insulation layers 18a to 18h.

Next, as illustrated in FIG. 2, unfired interlayer connecting conductor portions that will define and function as the interlayer connecting conductor portions 15a to 15n are formed in the ceramic green sheets that will define and function as the insulation layers 18a to 18g. Specifically, via holes are formed in the ceramic green sheets that will define and function as the insulation layers 18a to 18g by irradiating the sheets with a laser beam. An application method such as printing is then used to fill those via holes with a conductive paste containing a metal material such as Ag, Pd, Cu, Au, an alloy thereof, or the like.

Additionally, as illustrated in FIG. 2, unfired patterned conductor portions that will define and function as the patterned conductor portions 14a to 14g are provided on the surfaces of the ceramic green sheets that will define and function as the insulation layers 18b to 18h. Specifically, the patterned conductor portions 14a to 14g are formed by using a method such as screen printing, photolithography, or the like to apply a conductive paste containing Ag, Pd, Cu, Au, an alloy thereof, or the like as a primary component on the surfaces of the ceramic green sheets that will define and function as the insulation layers 18b to 18h. Note that the step of forming the patterned conductor portions 14a to 14g and the step of filling the via holes with the conductive paste may be carried out in the same step.

Next, as illustrated in FIG. 2, unfired outer electrodes that will define and function as the first and second outer electrodes 17a and 17b are provided on the surface of the ceramic green sheet that will define and function as the insulation layer 18a. Specifically, the first and second outer electrodes 17a and 17b are formed by using a method such as screen printing, photolithography, or the like to apply a conductive paste containing Ag, Pd, Cu, Au, an alloy thereof, or the like as a primary component on the surface of the ceramic green sheet that will define and function as the insulation layer 18a.

Then, as illustrated in FIG. 2, the ceramic green sheets that will define and function as the insulation layers 18a to 18h are stacked in order and pressure-bonded, and an unfired mother multilayer body is obtained. The stacking and pressure bonding of the ceramic green sheets that will define and function as the insulation layers 18a to 18h is carried out by first stacking and provisionally pressure-bonding one layer at a time to obtain the mother multilayer body, and then compressing the unfired mother multilayer body using an isostatic press or the like to carry out a final pressure bonding.

Next, a cutting blade is used to cut the mother multilayer body into the multilayer body 12 having predetermined dimensions (for example, approximately 2.5 mm×2.0 mm×1.1 mm), and an unfired multilayer body 12 is obtained as a result. The unfired multilayer body 12 is then subjected to a binder removal process, and is then fired. The binder removal process is carried out under conditions of, for example, about 500° C. for about two hours in a low-oxygen atmosphere. The firing is carried out under conditions of, for example, about 800° C. to about 900° C. for about 2.5 hours. The multilayer body 12 is furthermore subjected to barrel finishing.

Finally, the first and second outer electrodes 17a and 17b are plated with a metal such as Sn, Ni, Cu, Ag, Au, or the like. The laminated coil component 1 is obtained through this process.

The inductance values of the completed laminated coil components 1 are measured, defective components are removed, and non-defective components are packaged and shipped as products.

Second Preferred Embodiment

Figure 5:
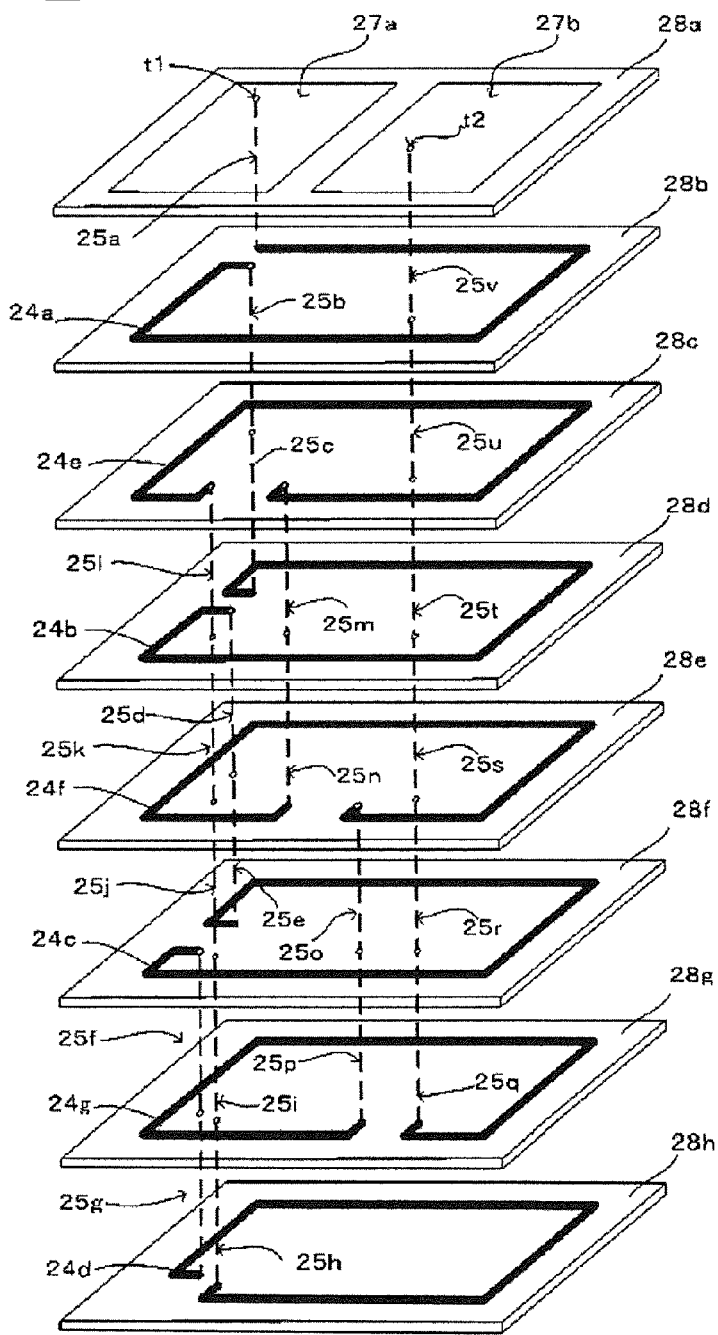
FIG. 5 is an exploded perspective view of a laminated coil component according to a second preferred embodiment of the present invention.

A laminated coil component 1 according to a second preferred embodiment of the present invention will be described hereinafter with reference to the drawings. An external view of the laminated coil component 1 is the same as in the first preferred embodiment. The laminated coil component 1 according to the second preferred embodiment includes a multilayer body 22 instead of the multilayer body 12 according to the first preferred embodiment. FIG. 5 is an exploded perspective view of the multilayer body 22 in the laminated coil component 1 according to the second preferred embodiment.

As illustrated in FIG. 5, the laminated coil component includes the multilayer body 22, and a first outer electrode 27a and a second outer electrode 27b provided on one main surface of the multilayer body 22. The multilayer body 22 has a rectangular or substantially rectangular parallelepiped shape, and includes a coil conductor including patterned conductor portions 24a to 24g and interlayer connecting conductor portions 25a to 25v. The multilayer body 22 includes insulation layers 28a to 28h arranged in that order.

As illustrated in FIG. 5, the patterned conductor portions 24a to 24g are provided upon the insulation layers 28b to 28h, respectively. The interlayer connecting conductor portions 25a to 25v are provided in the insulation layers 28a to 28g so as to pass therethrough in the thickness direction of the insulation layers. The interlayer connecting conductor portions 25a to 25v are electrically connected to the first outer electrode 27a, the patterned conductor portions 24a to 24g, and the second outer electrode 27b.

In the first preferred embodiment, the drop in the inductance value is equivalent to one layer's worth in the case where interlayer shorting has occurred in a location distanced in the lamination direction from the first and second outer electrodes 17a and 17b (for example, between the patterned conductor portion 14e and the patterned conductor portion 14d provided on the insulation layer 18g and the insulation layer 18h), which makes it difficult to detect defects caused by the interlayer shorting. However, according to the second preferred embodiment, there is a large drop in the inductance value regardless of which insulation layer the interlayer shorting occurs in, which makes it easy to detect defects caused by interlayer shorting. This is because the order of electrical connections of the patterned conductor portions that define the second coil portion is different from that in the first preferred embodiment.

The order of the electrical connections in the second coil portion will be described in more detail. The patterned conductor portion 24d is connected to the patterned conductor portion 24e by the interlayer connecting conductor portion 25h, which extends through the insulation layer 28g, the interlayer connecting conductor portion 25i, which extends through the insulation layer 28f, the interlayer connecting conductor portion 25j, which extends through the insulation layer 28f, the interlayer connecting conductor portion 25k, which extends through the insulation layer 28e, and the interlayer connecting conductor portion 25l, which extends through the insulation layer 28d. Accordingly, the patterned conductor portion 24d is connected, by the interlayer connecting conductor portions 25h, 25i, 25j, 25k, and 25l, to the patterned conductor portion 24e, which is adjacent to the insulation layer 28b on which the patterned conductor portion 24a of the first coil portion is provided. An end portion of the patterned conductor portion 24e located on a different side from the end portion connected to the interlayer connecting conductor portions 25h, 25i, 25j, 25k, and 25l is connected to the patterned conductor portion 24f by the interlayer connecting conductor portion 25m, which extends through the insulation layer 28c, and the interlayer connecting conductor portion 25n, which extends through the insulation layer 28d. As such, the patterned conductor portion 24e is connected to the patterned conductor portion 24f without being connected to the patterned conductor portion 24*b* provided therebetween in the lamination direction. Likewise, an end portion of the patterned conductor portion 24*f* located on a different side from the end portion connected to the interlayer connecting conductor portions 25*m* and 25*n* is connected to the patterned conductor portion 24*g* by the interlayer connecting conductor portion 25*o*, which extends through the insulation layer 28*e*, and the interlayer connecting conductor portion 25*p*, which extends through the insulation layer 28*f*. As such, the patterned conductor portion 24*f* is connected to the patterned conductor portion 24*g* without being connected to the patterned conductor portion 24*c* provided therebetween in the lamination direction. An end portion of the patterned conductor portion 24*g* located on a different side from the end portion connected to the interlayer connecting conductor portions 25*o* and 25*p* is connected, through the end portion t2 of the interlayer connecting conductor portion 25*v*, to the outer electrode 27*b*, by the interlayer connecting conductor portion 25*q*, the interlayer connecting conductor portion 25*r*, which extends through the insulation layer 28*f*, the interlayer connecting conductor portion 25*s*, which extends through the insulation layer 28*e*, the interlayer connecting conductor portion 25*t*, which extends through the insulation layer 28*d*, the interlayer connecting conductor portion 25*u*, which extends through the insulation layer 28*c*, and the interlayer connecting conductor portion 25*v*, which extends through the insulation layer 28*b*. As such, the patterned conductor portion 24*g* of the second coil portion, which is farthest from the second outer electrode 27*b*, is connected to the second outer electrode 27*b* by a single line defined by the interlayer connecting conductor portions 25*q* to 25*v*.

To rephrase, in the second preferred embodiment, one end of the second coil portion is connected to the first coil portion and another end is connected to the second outer electrode 27*b*, and an electrical flow follows both a path approaching the second outer electrode 27*b* in the lamination direction and a path away from the second outer electrode 27*b* in the lamination direction at least once. To put this differently, the first outer electrode 27*a* is connected by the interlayer connecting conductor portion 25*a* to the patterned conductor portion 24*a* in the uppermost layer of the first coil portion (the side closest to the main surface on which the outer electrode is formed), and the second outer electrode 27*b* is connected to the patterned conductor portion 24*g* in the lowermost layer of the second coil portion by the interlayer connecting conductor portions 25*q*, 25*r*, 25*s*, 25*t*, 25*u*, and 25*v*. This structure makes it easy to detect defects regardless of which layer interlayer shorting occurs in.

To describe this using an example, assume that interlayer shorting has occurred in the insulation layer 28*g* located between the patterned conductor portion 24*g* and the patterned conductor portion 24*d*. In the case where no interlayer shorting occurs, the path of the coil conductor progresses from the first outer electrode 27*a*, through the one end portion t1 of the coil conductor (this is also the end portion t1 of the interlayer connecting conductor portion 25*a*), connects to the interlayer connecting conductor portions 25*a* to 25*v* and the patterned conductor portions 24*a* to 24*g*, and connects to the second outer electrode 27*b* through the other end portion t2 of the coil conductor (this is also the end portion t2 of the interlayer connecting conductor portion 25*v*). However, when interlayer shorting occurs, the patterned conductor portion 24*g* and the patterned conductor portion 24*d* are connected, which makes the path shorter. Specifically, two layers' worth of patterned conductor portions, namely the patterned conductor portions 24*e* and 24*f*, are not used in the path, and thus the inductance value drops by an amount corresponding to those two layers. Unlike the first preferred embodiment, at least two layers' worth of the patterned conductor portions are not used in the path even in the case where interlayer shorting has occurred in the lowermost layer of the multilayer body 22.

Note that the connections are not limited to a case of being connected to the uppermost layer of the first coil portion and the lowermost layer of the second coil portion. The inductance value will drop greatly when interlayer shorting occurs if the first outer electrode 27*a* is connected to a patterned conductor portion, of the plurality of patterned conductor portions, that defines the first coil portion closer to one surface of the multilayer body from the center thereof (that is, 24*a* or 24*b*) and the second outer electrode 27*b* is connected to a patterned conductor portion that defines the second coil portion closer to another surface of the multilayer body from the center thereof (that is, 24*e* or 24*g*).

According to the laminated coil component 1 described above, a defect is detected no matter which layers interlayer shorting has occurred between.

Meanwhile, one layer's worth of a drop in the inductance value becomes more difficult to detect as the number of insulation layers on which the patterned conductor portions that define the coil conductor are provided increases, and thus the effects of various preferred embodiments of the present invention are exhibited. For example, the laminated coil component according to the second preferred embodiment preferably is provided with five or more insulation layers on which the patterned conductor portions are provided.

Third Preferred Embodiment

Figure 6:
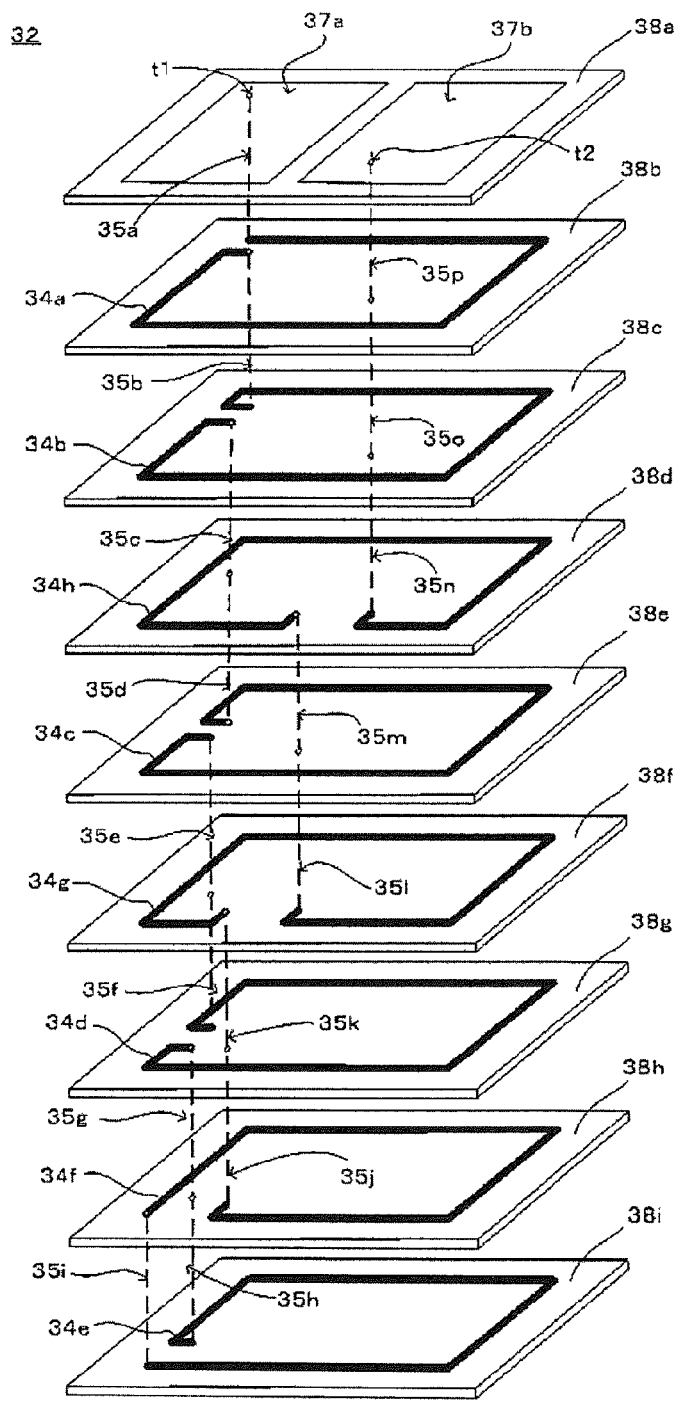
FIG. 6 is an exploded perspective view of a laminated coil component according to a third preferred embodiment of the present invention.

A laminated coil component 1 according to a third preferred embodiment of the present invention will be described hereinafter with reference to the drawings. An external view of the laminated coil component 1 is the same as in the first preferred embodiment. The laminated coil component 1 according to the third preferred embodiment includes a multilayer body 32 instead of the multilayer body 12 according to the first preferred embodiment. FIG. 6 is an exploded perspective view of the multilayer body 32 in the laminated coil component according to the third preferred embodiment.

As illustrated in FIG. 6, the laminated coil component 1 includes the multilayer body 32, and a first outer electrode 37*a* and a second outer electrode 37*b* provided on the same main surface of the multilayer body 32. The multilayer body 32 preferably has a rectangular or substantially rectangular parallelepiped shape, and includes a coil conductor including patterned conductor portions 34*a* to 34*h* and interlayer connecting conductor portions 35*a* to 35*p*. The multilayer body 32 includes insulation layers 38*a* to 38*i* laminated in that order.

As illustrated in FIG. 6, the patterned conductor portions 34*a* to 34*h* are provided upon the insulation layers 38*b* to 38*i*, respectively. The interlayer connecting conductor portions 35*a* to 35*n* are provided in the insulation layers 38*a* to 38*h* so as to pass therethrough in the thickness direction of the insulation layers. The interlayer connecting conductor portions 35*a* to 35*n* are electrically connected to the first outer electrode 37*a*, the patterned conductor portions 34*a* to 34*h*, and the second outer electrode 37*b*.

The laminated coil component according to the third preferred embodiment differs from the laminated coil component according to the first preferred embodiment in that the insulation layer 38*b* on which the patterned conductor portion 34*a* of the first coil portion is provided and the insulation layer 38c on which the patterned conductor portion 34b of the same first coil portion is provided are laminated consecutively.

According to the laminated coil component of the third preferred embodiment, the effects of preferred embodiments of the present invention are able to be achieved in the case where interlayer shorting has occurred between patterned conductor portions that define different coil portions.

Fourth Preferred Embodiment

Figure 7:
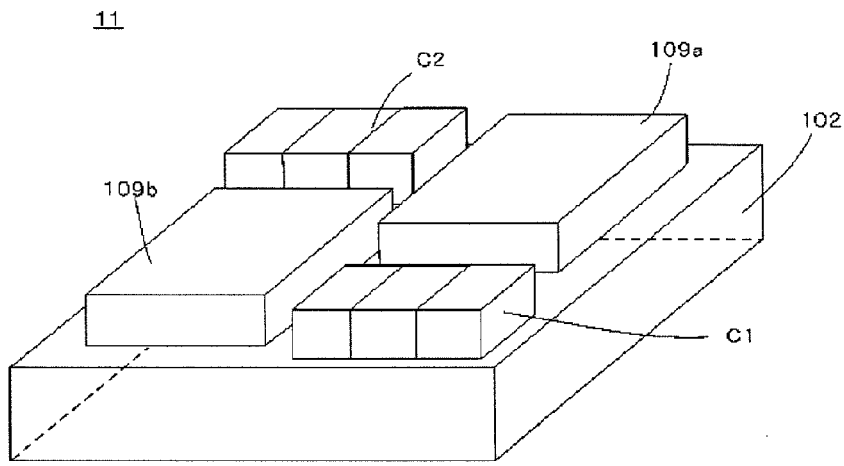
FIG. 7 is an external perspective view of a module component according to a fourth preferred embodiment of the present invention.
Figure 8:
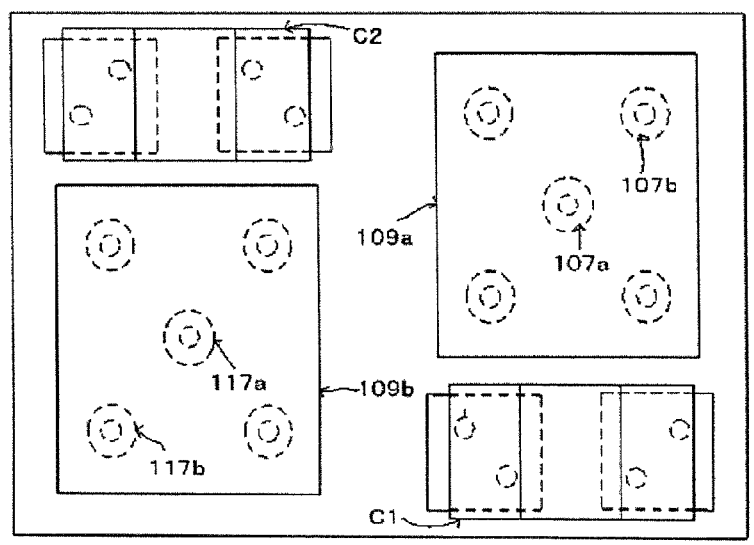
FIG. 8 is a plan view of the module component according to the fourth preferred embodiment of the present invention.
Figure 9:
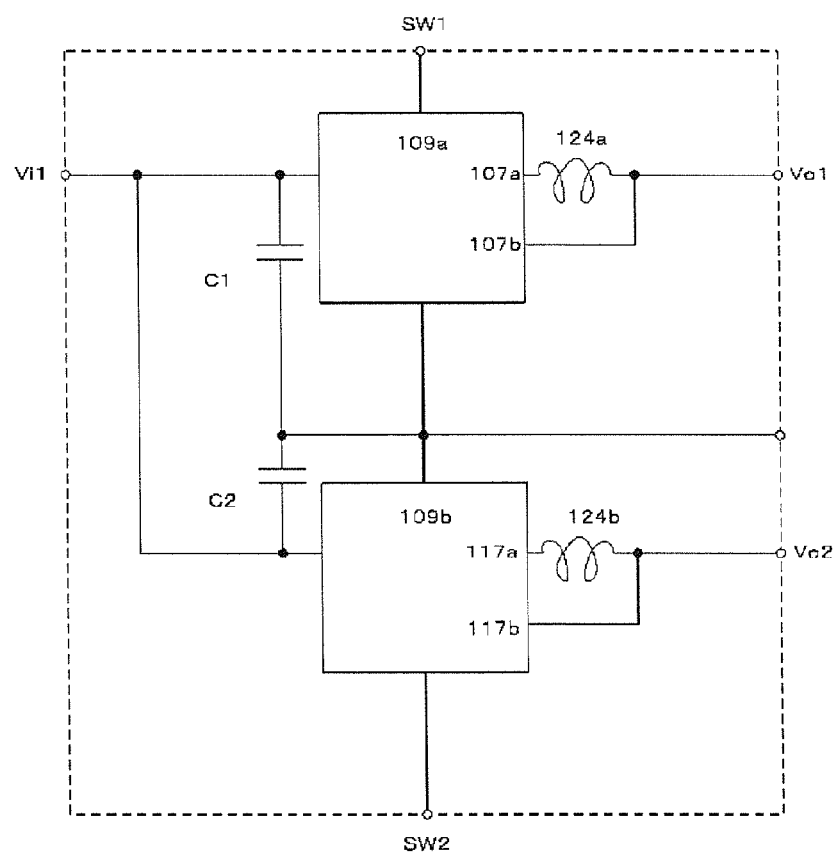
FIG. 9 is an equivalent circuit diagram of the module component according to the fourth preferred embodiment of the present invention.
Figure 10:
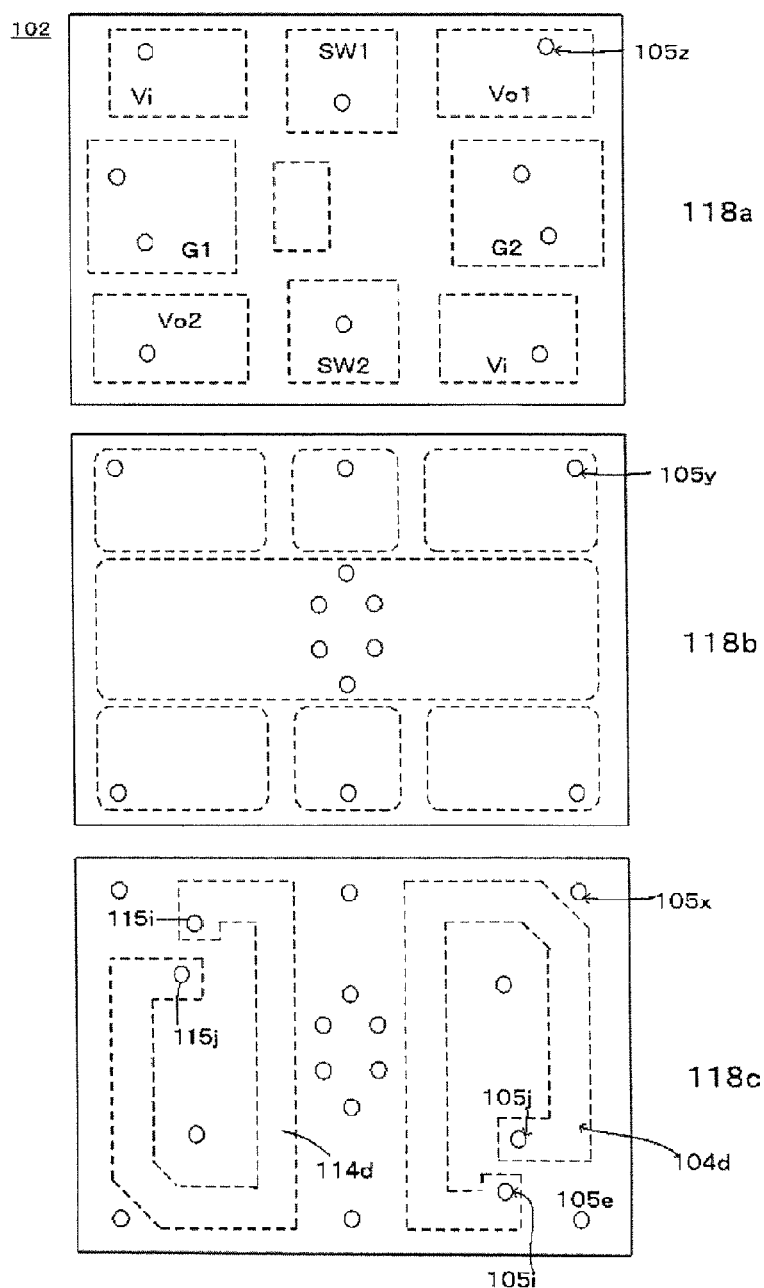
FIG. 10 is an exploded view of a first layer to a third layer of a multilayer body in the module component according to the fourth preferred embodiment of the present invention.
Figure 11:
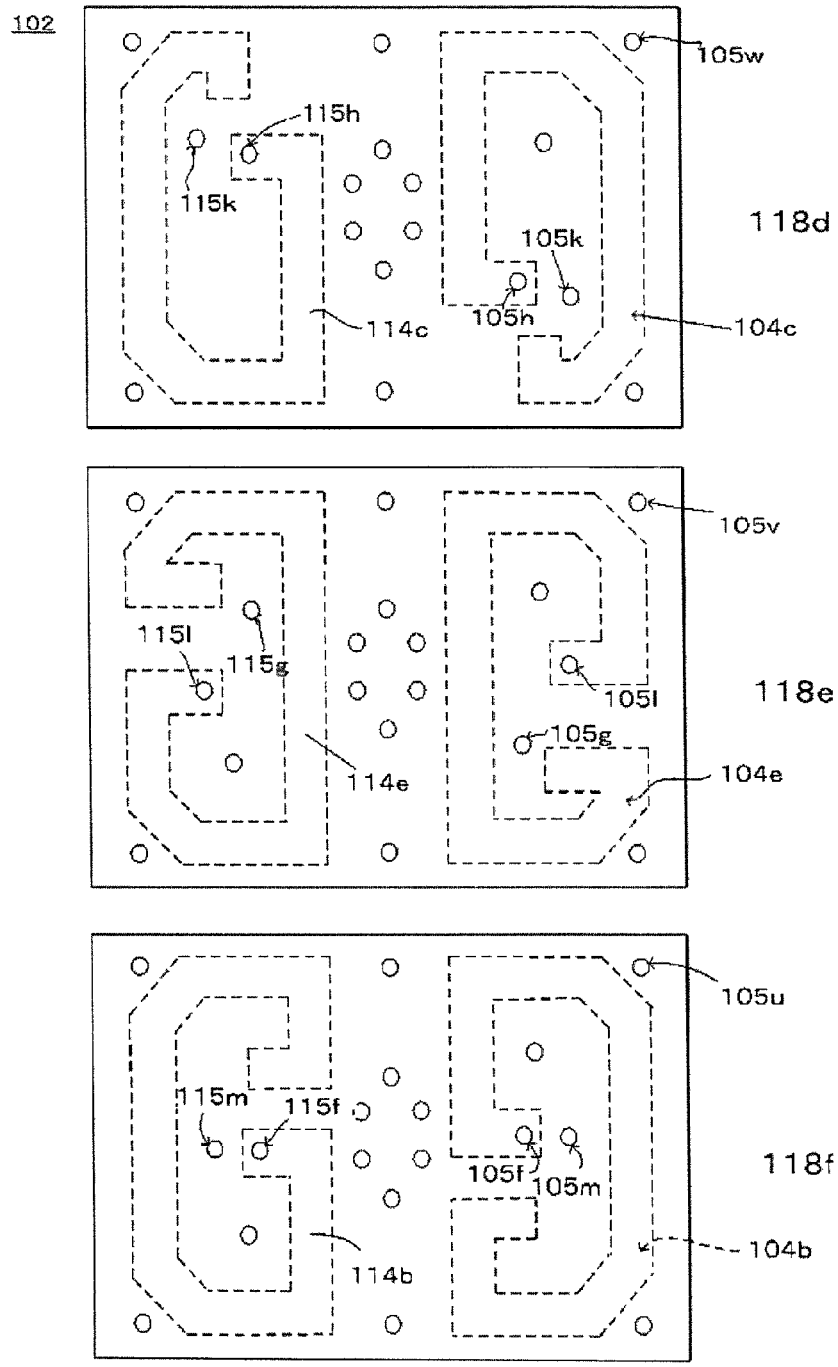
FIG. 11 is an exploded view of a fourth layer to a sixth layer of the multilayer body in the module component according to the fourth preferred embodiment of the present invention.
Figure 12:
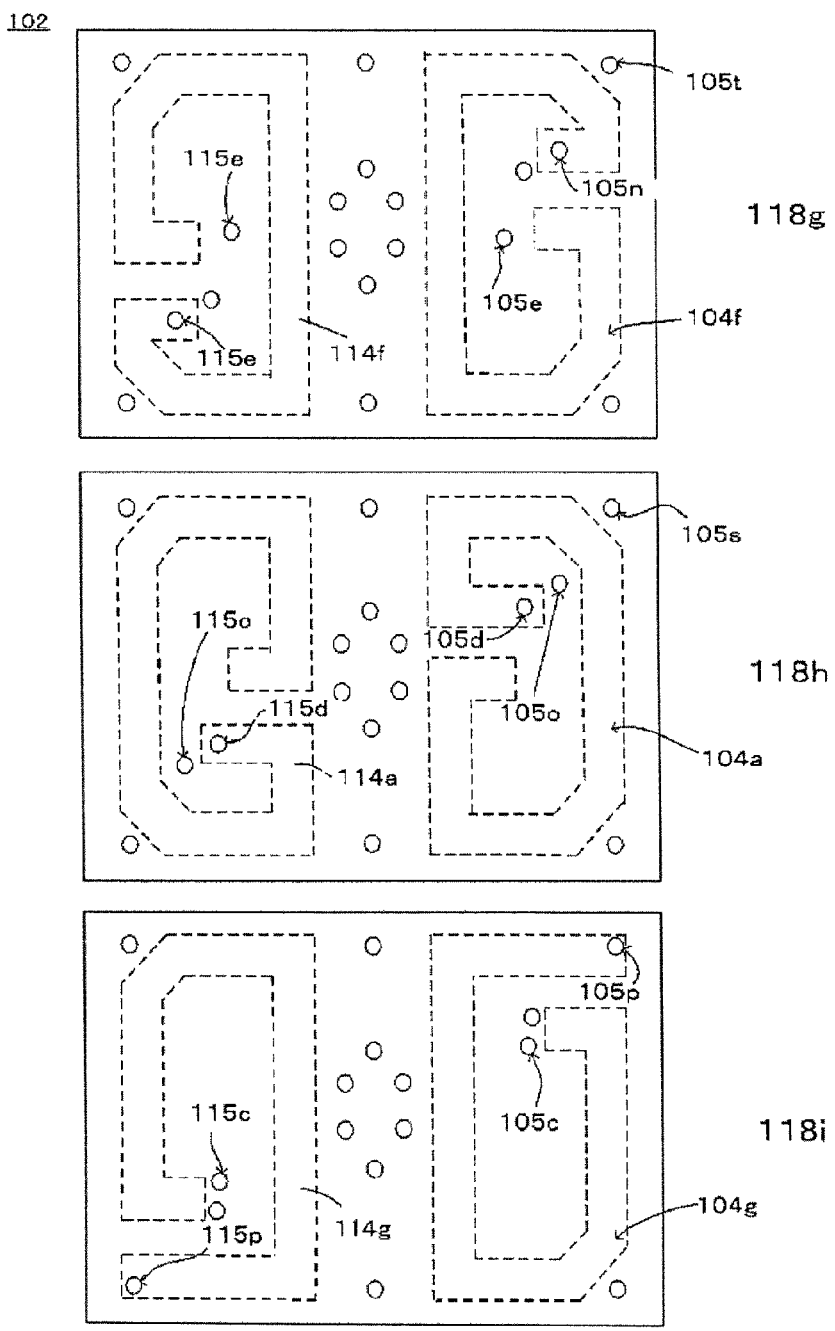
FIG. 12 is an exploded view of a seventh layer to a ninth layer of the multilayer body in the module component according to the fourth preferred embodiment of the present invention.

A DC-DC converter 11, which is a module component using a laminated coil component according to a preferred embodiment of the present invention as a multilayer substrate 102, will be described next. FIG. 7 is an external perspective view of the DC-DC converter 11 according to the present preferred embodiment. FIG. 8 is an external view of the DC-DC converter 11 according to the present preferred embodiment when viewed from a lamination surface. FIG. 9 is an equivalent circuit diagram illustrating the DC-DC converter 11 according to the present preferred embodiment. FIGS. 10 to 13 are diagrams illustrating the stacking of the respective layers of the multilayer substrate 102 according to the present preferred embodiment. Note that in FIGS. 10 to 13, solid lines indicate elements provided on the front side, whereas broken lines indicate elements provided on the back side.

As illustrated in FIGS. 7 and 8, chip capacitors C1 and C2 and ICs 109a and 109b are mounted on the multilayer substrate 102.

Furthermore, as illustrated in FIG. 9, two coil conductors, namely a coil 124a and a coil 124b, are provided in the multilayer substrate 102. An input Vi and outputs V01 and V02 are also provided in the multilayer substrate 102.

The coil 124a is connected to the control IC 109a through a first outer electrode 107a, an end of the coil 124a not connected to the control IC 109a branches in two paths, which are connected to the control IC 109a through a second outer electrode 107b and the output V01, respectively. The coil 124a and IC 109a and the coil 124b and IC 109b have the same connection relationships, and thus only the connection relationship of the coil 124a with the IC 109a and the output terminal V01 will be described below.

As illustrated in FIGS. 10 to 13, the multilayer substrate 102 includes 11 insulation layers, which are stacked in alphabetical order from an insulation layer 118a to an insulation layer 118k. The insulation layer 118a, the insulation layer 118j, and the insulation layer 118k of the multilayer substrate 102 are preferably non-magnetic insulation layers, whereas the insulation layers 118b to 118i are preferably magnetic insulation layers.

As illustrated in FIGS. 10 to 13, patterned conductor portions 104a to 104g are provided upon the insulation layers 118a to 118k, respectively, of the multilayer substrate 102. Each of the patterned conductor portions 104a to 104g preferably has a shape in which portion of a rectangular or substantially rectangular pattern has been cut out. Compared to the shapes of the patterned conductor portions according to the first preferred embodiment, the second preferred embodiment, and the third preferred embodiment, at least one corner of the rectangular or substantially rectangular shape is cut off. Interlayer connecting conductor portions 105p to 105z that connect to the output terminal V01 are provided at these locations where the corners are cut off. The patterned conductor portions overlap with each other when viewed in plan view from the lamination direction, defining an annular pattern. Outer electrodes 107a, 107b, 117a, and 117b to connect the ICs 109a and 109b and the capacitors C1 and C2 are provided on a rear surface of the insulation layer 118k. The outer electrodes of the coil 124a are 107a and 107b, and the outer electrodes of the coil 124b are 117a and 117b. The outer electrodes are connected to respective ICs and output terminals.

The patterned conductor portions are electrically connected by via hole conductors provided passing through the insulation layers. The via hole conductors are also electrically connected to the ICs, capacitors, and so on in addition to the patterned conductor portions, and are electrically connected to a conductor pattern provided on the insulation layer 118a. A conductor pattern to electrically connect to the input Vi, switches SW1 and SW2, grounds G1 and G2, and the output terminals V01 and V02 through the via hole conductors is provided on the insulation layer 118a.

Figure 13:
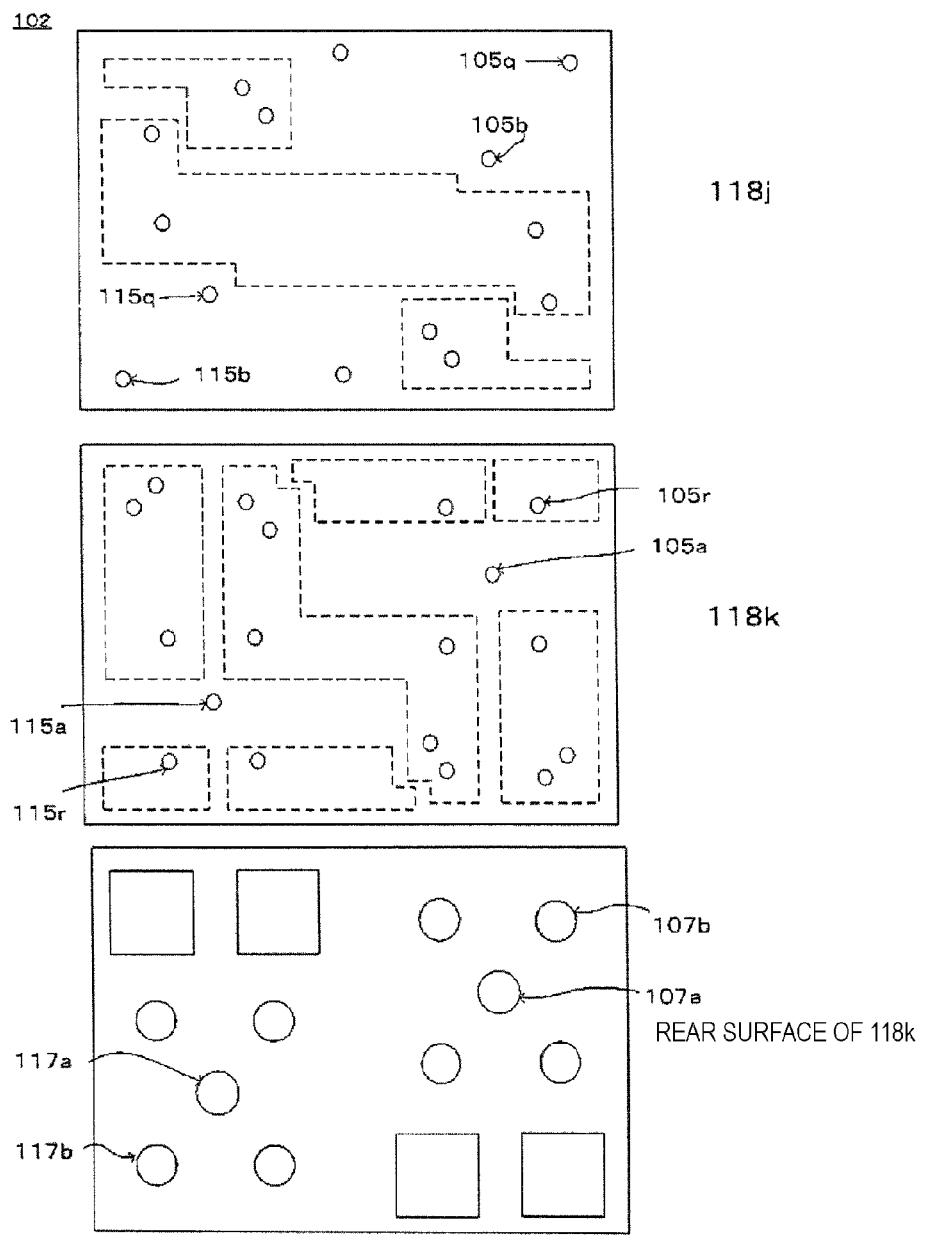
FIG. 13 is an exploded view of a tenth layer and an eleventh layer, and the rear surface of the eleventh layer, of the multilayer body in the module component according to the fourth preferred embodiment of the present invention.

Specifically, as illustrated in FIG. 13, the first outer electrode 107a that connects an IC to the coil 124a is provided on a surface of the insulation layer 118k on which the conductor pattern is not provided (this is also the rear surface). The IC 109a is connected, through the first outer electrode 107a provided on the insulation layer 118k, to the patterned conductor portion 104a provided on the insulation layer 118h by the interlayer connecting conductor portion 105a, which extends through the insulation layer 118k, the interlayer connecting conductor portion 105b, which extends through the insulation layer 118j, the interlayer connecting conductor portion 105c, which extends through the insulation layer 118i, and the interlayer connecting conductor portion 105d, which extends through the insulation layer 118h. As such, the IC 109a is electrically connected to the patterned conductor portion 104a through three layers, namely the insulation layers 118k, 118j, and 118i. Meanwhile, an end portion of the patterned conductor portion 104a located on a different side from the end portion connected to the interlayer connecting conductor portions 105b, 105c, and 105d is connected to the patterned conductor portion 104b by the interlayer connecting conductor portion 105e, which extends through the insulation layer 118g, and the interlayer connecting conductor portion 105f, which extends through the insulation layer 118f. As such, the patterned conductor portion 104a is connected to the patterned conductor portion 104b without being connected to the patterned conductor portion 104f provided therebetween in the lamination direction. Likewise, an end portion of the patterned conductor portion 104b located on a different side from the end portion connected to the interlayer connecting conductor portions 105e and 105f is connected to the patterned conductor portion 104c by the interlayer connecting conductor portion 105g, which extends through the insulation layer 118e, and the interlayer connecting conductor portion 105h, which extends through the insulation layer 118d. As such, the patterned conductor portion 104b is connected to the patterned conductor portion 104c without being connected to the patterned conductor portion 104e provided therebetween in the lamination direction. Additionally, an end portion of the patterned conductor portion 104c located on a different side from the end portion connected to the interlayer connecting conductor portions 105g and 105h is connected to the patterned conductor portion 104d by the interlayer connecting conductor portion 105i, which extends through the insulation layer 118c. As such, the patterned conductor portion 104c and the patterned conductor portion 104d are electrically connected consecutively. The patterned conductor portions 104a to 104d and the interlayer connecting conductor portions 105a to 105i that are respectively connected define the first coil portion.

An end portion of the patterned conductor portion 104d located on a different side from the end portion connected to the interlayer connecting conductor portion 105*i* is electrically connected to the patterned conductor portion 104*e* by the interlayer connecting conductor portion 105*j*, which extends through the insulation layer 118*c*, and the interlayer connecting conductor portion 105*k*, which extends through the insulation layer 118*d*. As such, the patterned conductor portion 104*d* is connected to the patterned conductor portion 104*e* without being connected to the patterned conductor portion 104*c* provided therebetween in the lamination direction. Likewise, an end portion of the patterned conductor portion 104*e* located on a different side from the end portion connected to the interlayer connecting conductor portions 105*j* and 105*k* is electrically connected to the patterned conductor portion 104*f* by the interlayer connecting conductor portion 105*l*, which extends through the insulation layer 118*e*, and the interlayer connecting conductor portion 105*m*, which extends through the insulation layer 118*f*. As such, the patterned conductor portion 104*e* is connected to the patterned conductor portion 104*f* without being connected to the patterned conductor portion 104*b* provided therebetween in the lamination direction. Furthermore, an end portion of the patterned conductor portion 104*f* located on a different side from the end portion connected to the interlayer connecting conductor portions 105*l* and 105*m* is electrically connected to the patterned conductor portion 104*g* by the via hole conductor 105*n*, which extends through the insulation layer 118*g*, and the via hole conductor 105*o*, which extends through the insulation layer 118*h*. As such, the patterned conductor portion 104*f* is connected to the patterned conductor portion 104*g* without being connected to the patterned conductor portion 104*a* provided therebetween in the lamination direction. An end portion of the patterned conductor portion 104*g* located on a different side from the end portion connected to the interlayer connecting conductor portions 105*n* and 105*o* is electrically connected to the outer electrode 107*b* by the interlayer connecting conductor portion 105*p*, which extends through the insulation layer 118*i*, the interlayer connecting conductor portion 105*q*, which extends through the insulation layer 118*j*, and the interlayer connecting conductor portion 105*r*, which extends through the insulation layer 118*k*. As such, the patterned conductor portion 104*g* is connected to the outer electrode 107*b*. The patterned conductor portions 104*e* to 104*g* and the interlayer connecting conductor portions 105*j* to 105*r* that are respectively connected define the second coil portion.

Meanwhile, the patterned conductor portion 104*g* is electrically connected to the output V01 by the interlayer connecting conductor portion 105*p*, which extends through the insulation layer 118*i*, the interlayer connecting conductor portion 105*s*, which extends through the insulation layer 118*h*, the interlayer connecting conductor portion 105*t*, which extends through the insulation layer 118*g*, the interlayer connecting conductor portion 105*u*, which extends through the insulation layer 118*f*, the interlayer connecting conductor portion 105*v*, which extends through the insulation layer 118*e*, the interlayer connecting conductor portion 105*w*, which extends through the insulation layer 118*d*, the interlayer connecting conductor portion 105*x*, which extends through the insulation layer 118*c*, the interlayer connecting conductor portion 105*y*, which extends through the insulation layer 118*b*, and the interlayer connecting conductor portion 105*z*, which extends through the insulation layer 118*a*.

Accordingly, the coil 124*a*, which includes the first coil portion and the second coil portion, is defined of the patterned conductor portions 104*a* to 104*g* and the interlayer connecting conductor portions 105*a* to 105*r*. Additionally, the path of the second coil portion branches in two, with one end electrically connected to the outer electrode 107*b* and another end electrically connected to the output V01.

The coil 124*b* includes the first coil portion and the second coil portion in the same manner as the coil 124*a*. Specifically, the coil 124*b* is defined of the patterned conductor portions 114*a* to 114*g* and the interlayer connecting conductor portions 115*a* to 115*r*, which are connected in the same alphabetical order as in the coil 124*a*. Additionally, the path of the second coil portion branches in two, with one end electrically connected to the outer electrode 117*b* and another end electrically connected to the output V02.

According to the multilayer substrate 102 included in the DC-DC converter 11 as described above, defects caused by interlayer shorting in the coil conductor are able to be detected in the multilayer substrate 102 alone, before mounting the ICs and the like. As such, interlayer shorting defects in the multilayer substrate are able to be detected without wasting expensive electronic components such as ICs.

Fifth Preferred Embodiment

A method of manufacturing a laminated coil component according to a fifth preferred embodiment will be described hereinafter. Here, manufacturing the laminated coil component described in the first preferred embodiment will be described as an example.

The method of manufacturing a laminated coil component described here is a method of manufacturing a laminated coil component including a process of forming a multilayer body block by sequentially stacking and pressure-bonding a plurality of insulative material sheets, on the surface of each of which a coil conductor is provided. In this manufacturing method, the plurality of insulative material sheets are structured so that a continuous coil that takes a thickness direction as a winding axis is defined by combining and electrically connecting the coil conductors provided on the plurality of insulative material sheets, with the continuous coil progressing toward a first side in the thickness direction and then reversing direction so as to progress toward a second side that is opposite from the first side. In the process of sequentially stacking and pressure-bonding, the location where the continuous coil reverses direction from the first side toward the second side is set to the side opposite from a side where the insulative material sheets experience a large amount of deformation during the process of sequentially stacking and pressure-bonding.

Here, using the example illustrated in FIG. 2, the "plurality of insulative material sheets" corresponds to the insulation layers 18*a* to 18*h*. The "continuous coil" corresponds to a coil defined by connecting the first coil portion and the second coil portion according to the first preferred embodiment in series. This is because coil portions defining a shape that reverses direction partway through can as a whole be considered a single coil. The "first side" corresponds to the lower side in FIG. 2, whereas the "second side" corresponds to the upper side in FIG. 2. The "location where the continuous coil reverses direction from the first side toward the second side" corresponds to the patterned conductor portion 14*d* in the example illustrated in FIG. 2. Using the example illustrated in FIG. 2, the multilayer body block is formed by sequentially stacking and pressure-bonding the insulation layers 18*a* to 18*h*. The continuous coil that takes the thickness direction as a winding axis is configured in the multilayer body block formed in this manner.

Figure 14:
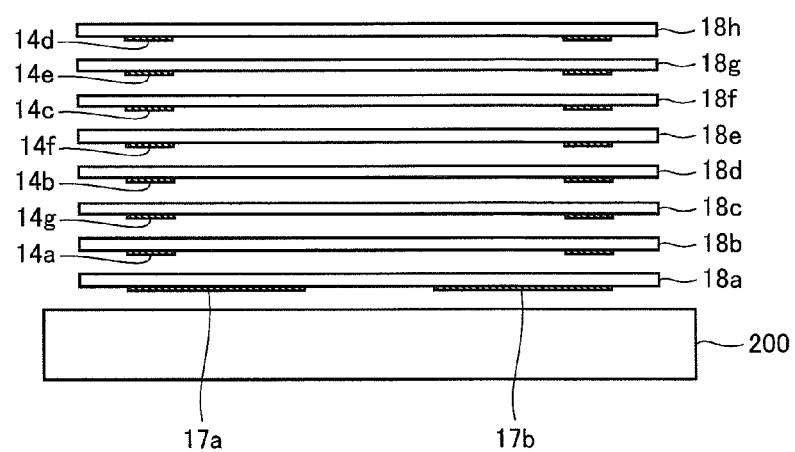
FIG. 14 is a schematic diagram illustrating a process of forming a multilayer body block by stacking and pressure-bonding layers in sequence in a method of manufacturing a laminated coil component according to a fifth preferred embodiment of the present invention.

Using the example illustrated in FIG. 2, it is easier to detect interlayer shorting in higher areas of the drawing than in lower areas. This is because higher areas in the drawing experience a greater decrease in the length of the coil path when interlayer shorting occurs. On the other hand, during the process of sequentially stacking and pressure-bonding, greater pressure is exerted on lower insulation layers, which makes it easier for the layers to deform. As such, during the process of sequentially stacking and pressure-bonding, the side closer to a platform located on the lower side is a side on which the insulative material sheets deform more. In the present preferred embodiment, during the process of sequentially stacking and pressure-bonding, the location where the continuous coil reverses direction from the first side to the second side is set to the side opposite from the side where the insulative material sheets experience a large amount of deformation during the process of sequentially stacking and pressure-bonding. In other words, as illustrated in FIG. 14, the outer electrodes 17a and 17b are arranged on the side where a platform 200 is located, and the insulation layer 18h having the patterned conductor portion 14d is arranged on the side farthest from the platform 200.

By carrying out the process of sequentially stacking and pressure-bonding in this manner, the side that experiences a larger degree of deformation corresponds to a side where interlayer shorting is easier to detect, and thus interlayer shorting is able to be detected effectively.

Note that it is preferable that the insulative material sheets be ceramic green sheets, and that a step of firing the multilayer body block be provided. Using this method makes it possible to achieve marked effects.

It is preferable that the multilayer body block include an LGA-type terminal on a main surface of the multilayer body block located opposite from the side where the continuous coil reverses direction from the first side toward the second side. In this case, the outer electrodes are the LGA-type terminal. Using this method makes it possible to input/output to/from the continuous coil using the LGA-type terminal. It is desirable to apply a large pressure between the LGA-type terminal and the insulative material sheet making contact therewith in order to increase the strength of the bond between the LGA-type terminal and the insulative material sheet. As described here, the LGA-type terminal being located on the main surface farthest from the location where the coil reverses direction means that the sequential stacking and pressure bonding will be carried out in a state where the surface on which the LGA-type terminal is provided is located on the side closest to the platform. As such, carrying out the sequential stacking and pressure bonding using this method also contributes to an increase in the strength of the bond with the LGA-type terminal.

Although the present preferred embodiment describes a method of manufacturing for obtaining a laminated coil component having the structure of the laminated coil component described in the first preferred embodiment, the concept described in the present preferred embodiment can also be suitably applied to the laminated coil components described in the other preferred embodiments of the present invention.

Preferred embodiments of the present invention can be applied in a laminated coil component, a module component that includes a multilayer coil component, and a method of manufacturing a laminated coil component.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A laminated coil component comprising:
   a coil conductor including a multilayer body that includes a plurality of insulation layers, a pair of main surfaces, side surfaces that connect the main surfaces, patterned conductor portions that are provided within the multilayer body and are provided on or at respective ones of the plurality of insulation layers, and interlayer connecting conductor portions that pass through the insulation layers and electrically connect the plurality of patterned conductor portions; and
   first and second outer electrodes provided on one of the main surfaces of the multilayer body; wherein
   the coil conductor includes a first coil portion and a second coil portion electrically connected in series;
   the patterned conductor portions that define the first coil portion and the patterned conductor portions that define the second coil portion are provided on or at respective insulation layers, and include portions that overlap with each other when viewed in plan view;
   the insulation layers on which the patterned conductor portions that define the second coil portion are provided are laminated between the plurality of insulation layers on which the patterned conductor portions that define the first coil portion are provided;
   the first outer electrode, which is electrically connected to the first coil portion, and the second outer electrode, which is electrically connected to the second coil portion, are provided on the same main surface of the multilayer body; and
   the second outer electrode is directly connected, by a single line defined by a plurality of the interlayer connecting conductor portions, to a patterned conductor portion of the second coil portion that is closer to the other main surface of the multilayer body than to the one main surface on which the first and second outer electrodes are provided.

2. The laminated coil component according to claim 1, wherein the first outer electrode is connected, through the interlayer connecting conductor portions, to the patterned conductor portion of the first coil portion closest to the one main surface, and the patterned conductor portion that the second outer electrode is directly connected to is the patterned conductor portion of the second coil portion closest to the other main surface.

3. The laminated coil component according to claim 1, wherein there are five or more of the insulation layers on which the patterned conductor portions are provided.

4. The laminated coil component according to claim 1, wherein the insulation layers are laminated so that all of the patterned conductor portions that define the first coil portion and the patterned conductor portions that define the second coil portion are in alternating positions.

5. The laminated coil component according to claim 1, wherein, of the patterned conductor portions that define the first coil portion and the patterned conductor portions that define the second coil portion, the patterned conductor portions that are adjacent in the lamination direction include portions having a same pattern shape.

6. The laminated coil component according to claim 1, wherein the first outer electrode is connected, through the interlayer connecting conductor portions, to the patterned conductor portion of the first coil portion closest to the one main surface, and the second outer electrode is connected to the patterned conductor portion of the second coil portion through at least two insulation layers.

7. A module component comprising:
   the laminated coil component according to claim 1 defining a multilayer substrate; and
   a mounted component on the multilayer substrate.

8. The module component according to claim 7, wherein the mounted component is an IC.

9. The module component according to claim 7, wherein the first outer electrode is connected, through the interlayer connecting conductor portions, to the patterned conductor portion of the first coil portion closest to the one main surface, and the patterned conductor portion that the second outer electrode is directly connected to is the patterned conductor portion of the second coil portion closest to the other main surface.

10. The module component according to claim 7, wherein there are five or more of the insulation layers on which the patterned conductor portions are provided.

11. The module component according to claim 7, wherein the insulation layers are laminated so that all of the patterned conductor portions that define the first coil portion and the patterned conductor portions that define the second coil portion are in alternating positions.

12. The module component according to claim 7, wherein, of the patterned conductor portions that define the first coil portion and the patterned conductor portions that define the second coil portion, the patterned conductor portions that are adjacent in the lamination direction include portions having a same pattern shape.

13. The module component according to claim 7, wherein the first outer electrode is connected, through the interlayer connecting conductor portions, to the patterned conductor portion of the first coil portion closest to the one main surface, and the second outer electrode is connected to the patterned conductor portion of the second coil portion through at least two insulation layers.

14. A laminated coil component comprising:
   a coil conductor including a multilayer body that includes a plurality of insulation layers, a pair of main surfaces, side surfaces that connect the main surfaces, patterned conductor portions that are provided within the multilayer body and are provided on or at respective ones of the plurality of insulation layers, and interlayer connecting conductor portions that pass through the insulation layers and electrically connect the plurality of patterned conductor portions; and
   first and second outer electrodes provided on one of the main surfaces of the multilayer body; wherein
   the coil conductor includes a first coil portion and a second coil portion electrically connected in series;
   the patterned conductor portions that define the first coil portion and the patterned conductor portions that define the second coil portion are provided on or at respective insulation layers, and include portions that overlap with each other when viewed in plan view;
   the insulation layers on which the patterned conductor portions that define the second coil portion are provided are laminated between the plurality of insulation layers on which the patterned conductor portions that define the first coil portion are provided;
   the first outer electrode, which is electrically connected to the first coil portion, and the second outer electrode, which is electrically connected to the second coil portion, are provided on the same main surface of the multilayer body; and
   the interlayer connecting conductor portions are provided so that the patterned conductor portions in at least two layers are not used as an electrical path regardless of which insulation layer interlayer shorting has occurred in.

15. A module component comprising:
   a laminated coil component including:
      a coil conductor including a multilayer body that includes a plurality of insulation layers, a pair of main surfaces, side surfaces that connect the main surfaces, patterned conductor portions that are provided within the multilayer body and are provided on or at respective ones of the plurality of insulation layers, and interlayer connecting conductor portions that pass through the insulation layers and electrically connect the plurality of patterned conductor portions; and
      first and second outer electrodes provided on one of the main surfaces of the multilayer body; wherein
      the coil conductor includes a first coil portion and a second coil portion electrically connected in series;
      the patterned conductor portions that define the first coil portion and the patterned conductor portions that define the second coil portion are provided on or at respective insulation layers, and include portions that overlap with each other when viewed in plan view;
      the insulation layers on which the patterned conductor portions that define the second coil portion are provided are laminated between the plurality of insulation layers on which the patterned conductor portions that define the first coil portion are provided;
      the first outer electrode, which is electrically connected to the first coil portion, and the second outer electrode, which is electrically connected to the second coil portion, are provided on the same main surface of the multilayer body; and
      the laminated coil component defines a multilayer substrate; and
   a mounted component on the multilayer substrate; wherein
   the interlayer connecting conductor portions are provided so that the patterned conductor portions in at least two layers are not used as an electrical path regardless of which insulation layer interlayer shorting has occurred in.

* * * * *